(12) United States Patent
Shinohara et al.

(10) Patent No.: US 7,173,951 B2
(45) Date of Patent: Feb. 6, 2007

(54) SEMICONDUCTOR LASER DEVICE WITH LIGHT RECEIVING ELEMENT

(75) Inventors: Hisayuki Shinohara, Nara (JP); Ayumi Yagi, Yamatotakada (JP); Kazunori Matsubara, Nara (JP); Tetsuyoshi Inoue, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 322 days.

(21) Appl. No.: 10/777,190

(22) Filed: Feb. 13, 2004

(65) Prior Publication Data
US 2004/0223532 A1 Nov. 11, 2004

(30) Foreign Application Priority Data
Mar. 25, 2003 (JP) .............................. 2003-082948
Aug. 4, 2003 (JP) .............................. 2003-205759

(51) Int. Cl.
H01S 3/04 (2006.01)
(52) U.S. Cl. ....................................................... 372/36
(58) Field of Classification Search ................. 372/36, 372/34; 257/433, 99
See application file for complete search history.

(56) References Cited

U.S. PATENT DOCUMENTS

| | | | | |
|---|---|---|---|---|
| 5,727,009 A | * | 3/1998 | Tajiri et al. ............... | 372/50.11 |
| 5,776,802 A | * | 7/1998 | Ochi et al. .................. | 438/123 |
| 6,335,548 B1 | * | 1/2002 | Roberts et al. ................ | 257/98 |
| 2002/0101574 A1 | * | 8/2002 | Tsuji ............................ | 355/69 |

FOREIGN PATENT DOCUMENTS

| | | |
|---|---|---|
| JP | 6-5990 | 1/1994 |
| JP | 6-203403 | 7/1994 |
| JP | 11-25465 | 1/1999 |
| JP | 2000-196176 | 7/2000 |
| JP | 2000-196177 | 7/2000 |
| JP | 2001-111159 | 4/2001 |

* cited by examiner

Primary Examiner—Minsun O. Harvey
Assistant Examiner—Tuan N. Nguyen
(74) Attorney, Agent, or Firm—Nixon & Vanderhye, PC.

(57) ABSTRACT

A semiconductor laser device includes a package having a front surface, a rear surface and an outer peripheral surface; a semiconductor laser element and a light receiving element provided on the front surface; a plurality of leads arranged in spaced relation on the front surface as extending outward from the package; and an optical element supported above the front surface with its optical axis perpendicular to the front surface for guiding a laser beam emitted from the semiconductor laser element toward an object and guiding light reflected on the object to the light receiving element; wherein the outer peripheral surface is configured so as to be fitted in a cylindrical hole having an axis parallel to the optical axis of the optical element, and has a recess extending from the front surface to the rear surface, and the leads are bent as extending from the front surface and passing through the recess with distal portions thereof extending along the optical axis of the optical element and with proximal ends thereof electrically connected to the semiconductor laser element and the light receiving element.

17 Claims, 15 Drawing Sheets

SEMICONDUCTOR LASER DEVICE WITH LIGHT RECEIVING ELEMENT

CROSS-REFERENCE TO RELATED APPLICATIONS

This application is related to Japanese patent application Nos.2003-082948 filed on Mar. 25, 2003 and 2003-205759 filed on Aug. 4, 2003, whose priorities are claimed under 35 USC § 119, the disclosures of which are incorporated by reference in their entirety.

BACKGROUND OF THE INVENTION

1. Field of the Invention

The present invention relates to a semiconductor laser device and, particularly, to a semiconductor laser device for use in a light pick-up device which reads information recorded on an optical recording medium.

2. Description of the Related Art

A light pick-up device which reads an optical signal on an optical memory device such as a CD-ROM or an MD (mini-disk) comprises a semiconductor laser device of a hologram laser system. The hologram laser system employs a semiconductor laser element, a hologram element and a signal light receiving element incorporated in a single package, and is adapted to project a light beam from the semiconductor laser element toward a disk (optical recording medium), diffract the light beam reflected from the disk by the hologram element, and guide the light beam to the light receiving element disposed apart from an optical axis.

The following devices are known to be related to the present invention.

(1) A semiconductor laser device comprising at least a semiconductor laser chip provided on a lead frame sealed with a resin material, the resin material containing particles of an insulative material having a high thermal conductivity (see, for example, Japanese Unexamined Patent Publication No. 11-25465 (1999)).

(2) A semiconductor laser device comprising a chip mount on which a semiconductor laser element is mounted, a frame surrounding the chip mount, and two projections provided on the frame in opposed relation with the chip mount held therebetween (see, for example, Japanese Unexamined Patent Publication No. 2001-111159).

(3) A semiconductor laser device comprising a chip mount on which a semiconductor laser element is mounted, a frame surrounding a surface of the chip mount on which the semiconductor laser element is mounted, two projections provided on the frame in opposed relation with the chip mount held therebetween, and an optical element provided on the frame between the two projections (see, for example, Japanese Unexamined Patent Publication No. 2000-196177).

(4) A package comprising a frame surrounding a semiconductor element mount, the frame having an outer peripheral surface including a surface formed by axially cutting away a part of a cylindrical surface (see, for example, Japanese Unexamined Patent Publication No. 2000-196176)

(5) A semiconductor laser device comprising a semiconductor laser chip provided on a chip mount, outer leads provided around the chip mount and having contacts connected to electrodes of the semiconductor laser chip, and a frame of an insulative material surrounding the chip mount and the contacts of the outer leads (see, for example, Japanese Unexamined Patent Publication No. 6-203403 (1994)).

(6) A semiconductor laser package for a hologram laser unit, the package comprising a semiconductor laser chip as a light source, a PIN photodiode for monitoring a laser beam emitted from the semiconductor laser chip, and a photodiode for reading signals on an optical disk, which are provided on a single planar stem and covered with a cap on the stem, and a glass plate formed with a diffraction grating for polarization and provided on an upper surface of a cap, wherein the stem has a generally elliptical plan shape such as defined by two opposed arcs and two opposed chords by removing two opposed segments from a circle, and the arcs of the stem of the generally elliptical shape serve as a reference member which determines a light emitting point of the semiconductor laser chip (see, for example, Japanese Unexamined Patent Publication No. 6-5990 (1994)).

These conventional semiconductor laser devices attempt to satisfy the following requirements:

(1) Reduction of the package size of the semiconductor laser device for realization of a pick-up device, a CD drive or a CD player having a reduced size and thickness; and (2) Improvement of the positioning accuracy of the semiconductor laser device in the pick-up device for facilitating the adjustment of three beams by rotation.

However, none of the conventional semiconductor laser devices sufficiently satisfy these requirements.

SUMMARY OF THE INVENTION

In view of the foregoing, the present invention is directed to a semiconductor laser device which makes it possible to further reduce the package size, improve the positioning accuracy when the semiconductor laser device is mounted, and facilitate the adjustment of three beams by rotation.

A semiconductor laser device comprises: a package having a front surface, a rear surface and an outer peripheral surface; a semiconductor laser element and a light receiving element provided on the front surface; a plurality of leads arranged in spaced relation on the front surface as extending outward from the package; and an optical element supported above the front surface with its optical axis perpendicular to the front surface for guiding a laser beam emitted from the semiconductor laser element toward an object and guiding light reflected on the object to the light receiving element; wherein the outer peripheral surface is configured so as to be fitted in a cylindrical hole having an axis parallel to the optical axis of the optical element, and has a recess extending from the front surface to the rear surface; and the leads are bent as extending from the front surface and passing through the recess with distal portions thereof extending along the optical axis of the optical element and with proximal ends thereof electrically connected to the semiconductor laser element and the light receiving element.

The outer peripheral surface of the package is configured so as to be fitted in the cylindrical hole, and the leads are bent downward from the package through the recess of the outer peripheral surface of the package. Therefore, the exterior size of the semiconductor laser device can be reduced, and the semiconductor laser device can easily be mounted in a hole of a housing of a pick-up device.

DETAILED DESCRIPTION OF THE INVENTION

Figure 1:
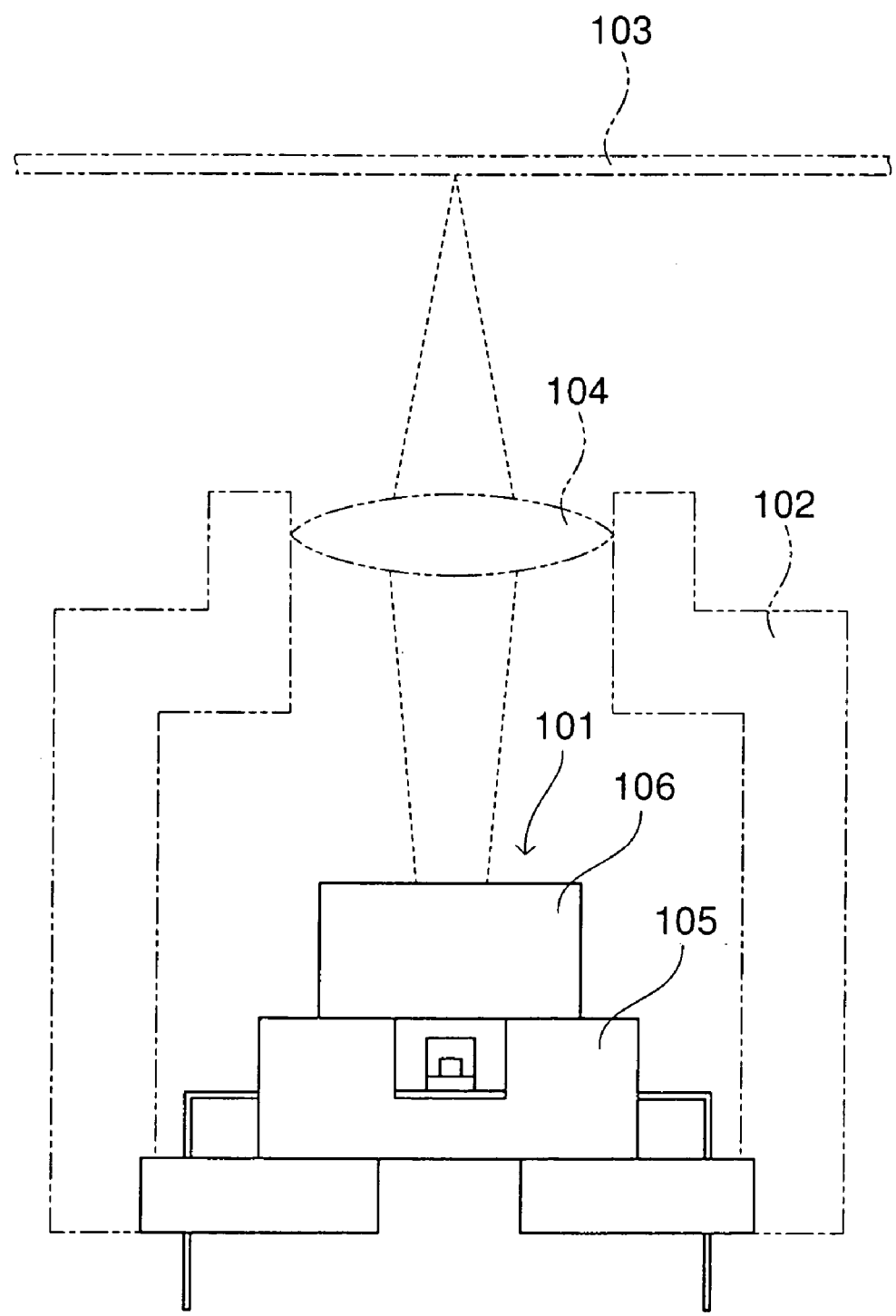
FIG. 1 is a front view of a semiconductor laser device according to a first example embodiment, which is mounted in a light pick-up device.

A semiconductor laser device comprises: a package having a front surface, a rear surface and an outer peripheral surface; a semiconductor laser element and a light receiving element provided on the front surface; a plurality of leads arranged in spaced relation on the front surface as extending outward from the package; and an optical element supported above the front surface with its optical axis perpendicular to the front surface for guiding a laser beam emitted from the semiconductor laser element toward an object and guiding light reflected on the object to the light receiving element; wherein the outer peripheral surface is configured so as to be fitted in a cylindrical hole having an axis parallel to the optical axis of the optical element, and has a recess extending from the front surface to the rear surface, and the leads are bent as extending from the front surface and passing through the recess with distal portions thereof extending along the optical axis of the optical element and with proximal ends thereof electrically connected to the semiconductor laser element and the light receiving element.

The optical axis of the optical element may be aligned with the axis of the cylindrical hole. A hologram element may be employed as the optical element.

The package may comprise a planar substrate, and a plurality of projections arranged in spaced relation as projecting outward from the substrate parallel to the substrate, and the recess may be defined between adjacent two of the projections. Alternatively, the recess of the outer peripheral surface may be formed by cutting away a part of the outer peripheral surface extending from the front surface to the rear surface.

The substrate may have an opening for air-cooling the semiconductor laser element.

The substrate may be rectangular, and the projections may project outward from four corners of the substrate.

The leads may extend from two opposite edges of the rectangular substrate and be bent perpendicularly.

The semiconductor laser device may further comprise a mirror provided on a surface of the substrate for reflecting the laser beam emitted from the semiconductor laser element perpendicularly to the substrate surface.

The substrate and the projections may integrally be formed of the same material.

The substrate may have an end face configured so as to receive a lead bending spacer between the leads and the end face of the substrate when the leads are bent.

The leads may each include an inner lead portion present inside the package and an outer lead portion present outside the package, and the outer lead portions of the leads are arranged at greater intervals than the inner lead portions of the leads.

The intervals of the inner lead portions may increase away from proximal portions thereof.

According to another aspect of the present technology, a semiconductor laser device comprises: a substrate; a plurality of substrate support blocks projecting outward from the substrate in spaced relation parallel to the substrate, the substrate support blocks cooperatively defining an outer peripheral surface which is configured so as to be fitted in a cylindrical hole; a semiconductor laser element, a light receiving element, an optical element and a plurality of leads provided on a front surface of the substrate, the optical element being adapted to guide a laser beam from the semiconductor laser element toward an object and guide a light beam reflected on the object to the light receiving element; wherein the leads have proximal ends electrically connected to the semiconductor laser element and the light receiving element, and distal portions extending from an end face of the substrate to be bent and further extending through a gap defined between adjacent two of the substrate support blocks toward a rear surface of the substrate.

According to further another aspect of the present technology, a semiconductor laser device comprises: a package having a front surface and a rear surface; a plurality of interconnection leads arranged in spaced relation on the front surface of the package as extending outward from the package; a semiconductor laser element, a reflective mirror, a light receiving element and an optical element provided on the front surface of the package, the optical element being adapted to guide a laser beam emitted from the semiconductor laser element toward a medium carrying external information recorded thereon and further guide light reflected on the medium to the light receiving element; wherein the leads are electrically connected to the semiconductor laser element and the light receiving element, the leads each including an inner lead portion present inside the package and an outer lead portion present outside the package, the outer lead portions of the leads being arranged at greater intervals than the inner lead portions of the leads, and bent toward the rear surface of the package.

EMBODIMENTS

With reference to the attached drawings, the present invention will hereinafter be described in detail by way of embodiments thereof. It should be understood that the invention be not limited to these embodiments.

First Embodiment

FIG. 1 is a front view of a semiconductor laser device according to a first example embodiment, which is mounted in a light pick-up device. As shown, the semiconductor laser device 101 is fitted in a cylindrical mount hole of a housing 102 of the pick-up device. The semiconductor laser device 101 is adapted to emit a laser beam via an objective lens 104 toward an optical disk (a recording medium adapted for optical writing and reading of information) 103 and receive a light beam reflected on the optical disk via the objective lens 104.

Figure 2:
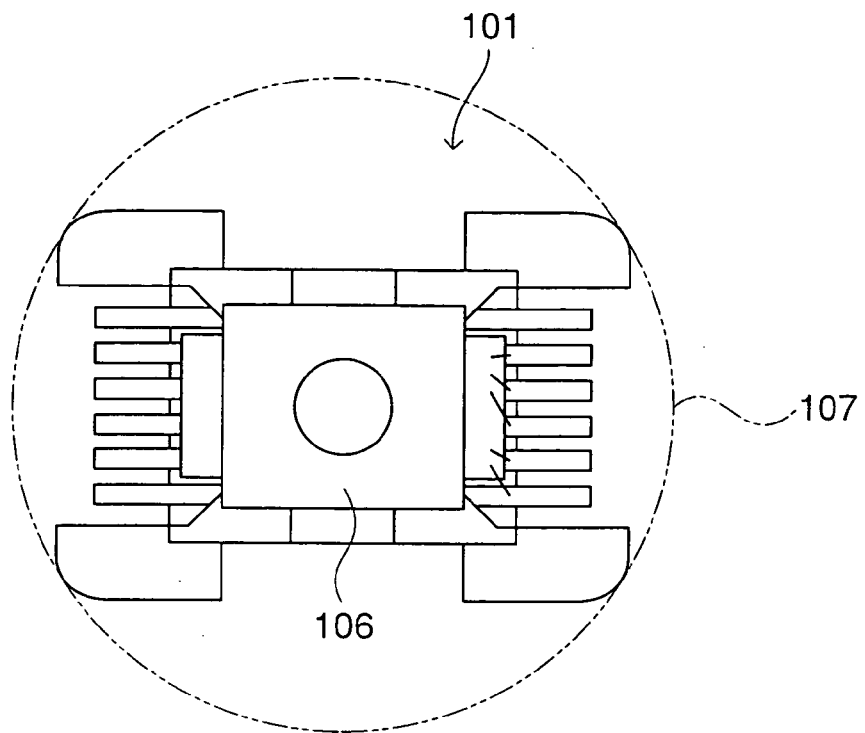
FIG. 2 is a top view of the semiconductor laser device of FIG. 1.
Figure 3:
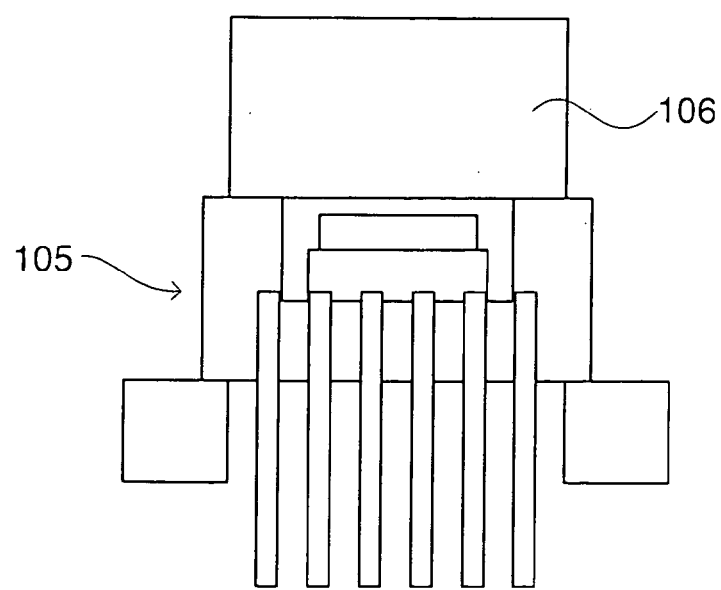
FIG. 3 is a side view of the semiconductor laser device of FIG. 1.

FIG. 2 is a top view of the semiconductor laser device 101 fitted in the cylindrical mount hole 107 of the housing 102. FIG. 3 is a side view of the semiconductor laser device 101.

As shown in these figures, the semiconductor laser device 101 includes a package 105 and a hologram element 106 mounted on the package 105.

Figure 4:
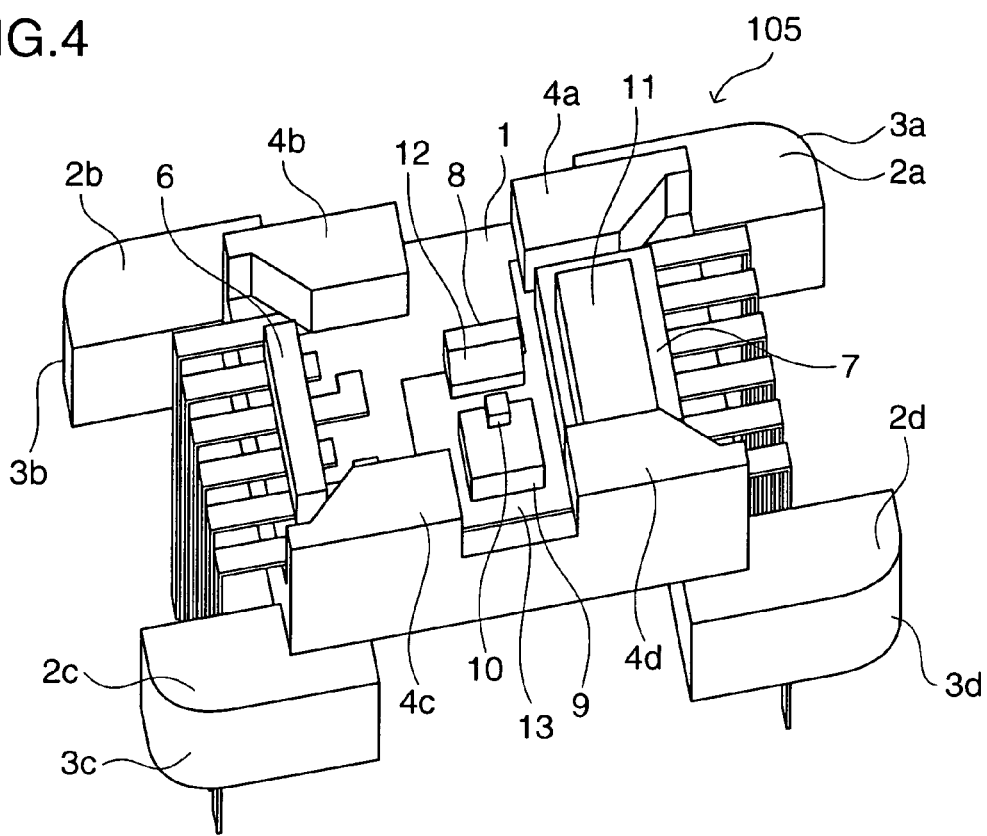
FIG. 4 is a perspective view of a package of the semiconductor laser device of FIG. 1.
Figure 5:
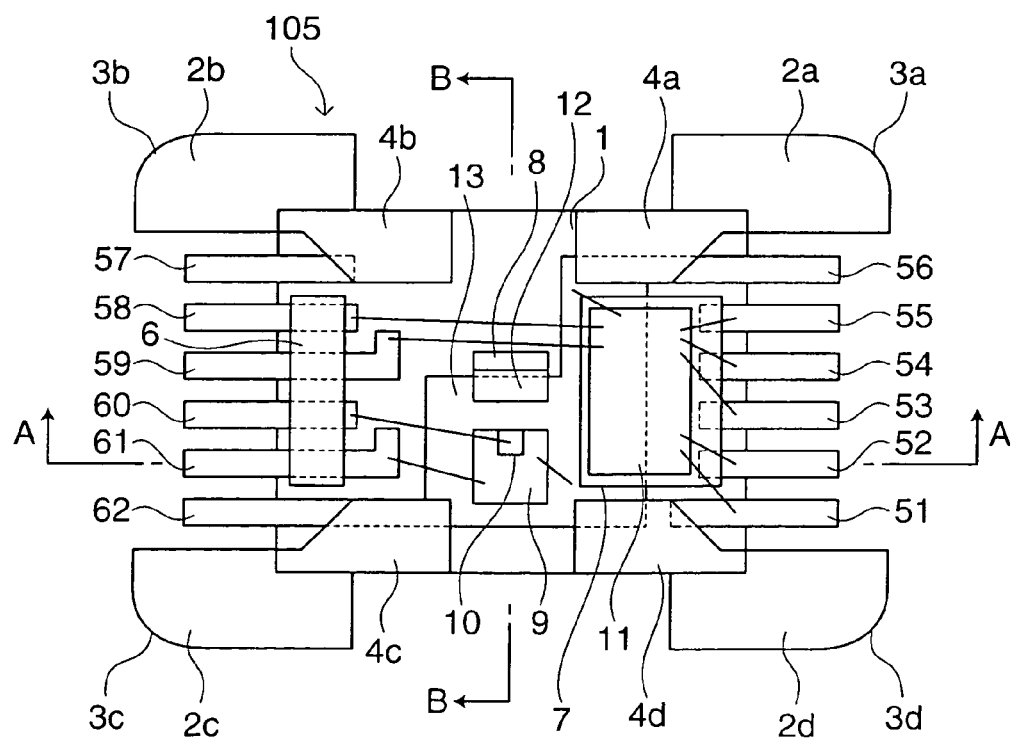
FIG. 5 is a top view of the package of the semiconductor laser device of FIG. 1.
Figure 6:
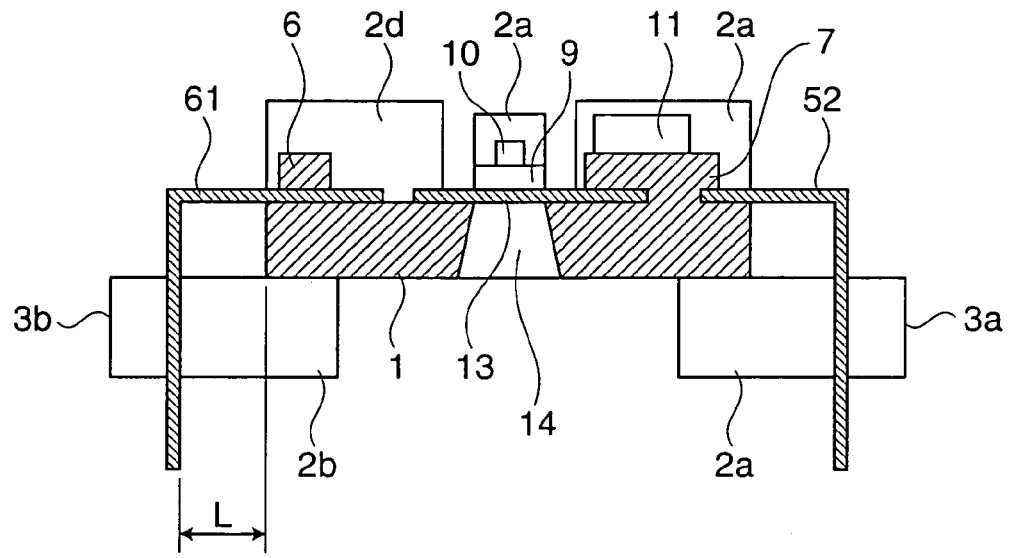
FIG. 6 is a sectional view of the package as seen in an arrow direction A—A in FIG. 5.
Figure 7:
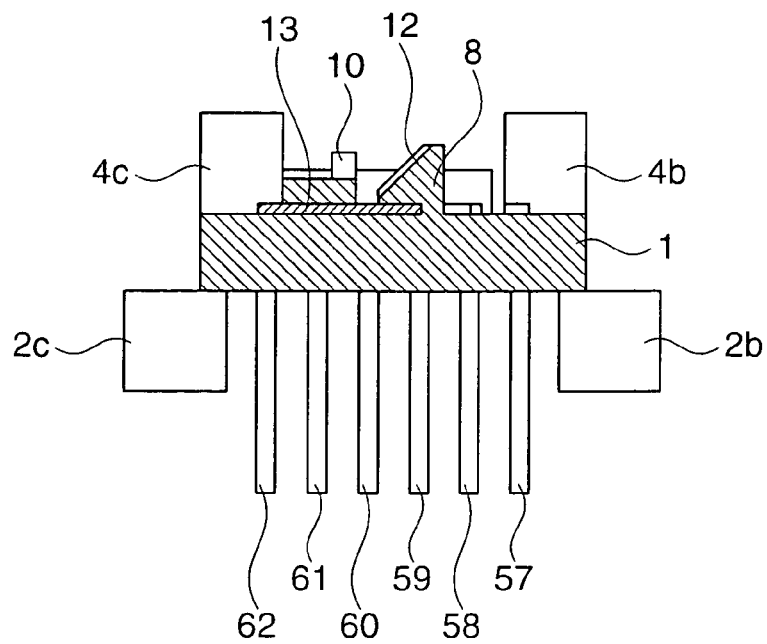
FIG. 7 is a sectional view of the package as seen in an arrow direction B—B in FIG. 5.

FIG. 4 is a perspective view of the package 105 with the hologram element 106 removed from the semiconductor laser device 101. FIG. 5 is a top view of the package 105. FIGS. 6 and 7 are sectional views of the package 105 as seen in arrow directions A—A and B—B, respectively, in FIG. 5.

As shown in FIGS. 4 to 7, the package 105 includes a rectangular substrate 1, and projections (substrate support blocks) 2a to 2d formed integrally with the substrate 1 as projecting horizontally outward from four corners of the substrate 1. The blocks 2a to 2d respectively have outer peripheral surface portions 3a to 3d cooperatively configured so as to be fitted in the mount hole 107 as shown in FIG. 2. Hologram element support blocks 4a to 4d, a lead press block 6, a light receiving element support block 7 and a mirror support block 8 are provided on an upper surface of the substrate 1 integrally with the substrate 1. As shown in FIG. 1, the hologram element support blocks 4a to 4d support the hologram element 106.

The substrate 1 includes leads 51 to 62 and a conductive plate (island plate) 13 provided on an upper surface thereof.

Proximal ends of the leads 51 and 57 are fixed to the upper surface of the substrate 1 by the blocks 4d and 4b, respectively, and proximal ends of the leads 52 to 55 are fixed to the upper surface of the substrate 1 by the block 7. The conductive plate 13 is fixed to the upper surface of the substrate 1 by the blocks 4a, 4c, 4d and 8, and the leads 56 and 62 extend laterally from the conductive plate 13.

A semiconductor laser element 10 is mounted on an upper surface of the conductive plate 13 with the intervention of a sub-mount 9. A light receiving element 11 is mounted on the light receiving element support block 7, and a mirror 12 is mounted on the mirror support block 8.

Distal portions of the leads 51 to 56 extend from one of opposite side edges of the substrate 1 to be bent at 90 degrees between the blocks 2a and 2d, and further extend downward. Distal portions of the leads 57 to 62 extend from the other side edge of the substrate 1 to be bent at 90 degrees between the blocks 2b and 2c, and further extend downward.

The conductive plate 13 is interposed between the upper surface of the substrate 1 and the sub-mount 9, and serves as a heat sink and as a conductor.

The leads 51 to 55, 58 and 59 are connected (wire-bonded) to the light receiving element 11 by gold wires, and the leads 60, 61 are connected to the semiconductor laser element 10 by gold wires. Further, the conductive plate 13 is connected to the light receiving element 11 and the semiconductor laser element 10 by gold wires.

The blocks 2a to 2d, 4a to 4d, the blocks 6, 8, 11 and the substrate 1 are integrally molded from an epoxy resin as will be described later. The leads 51 to 62 and the conductive plate 13 are fixed onto the substrate 1 in the aforesaid manner in the molding. The sub-mount 9 is formed of silicon.

As shown in FIG. 6, the substrate 1 has a through-hole 14 of a truncated cone shape formed therein in opposed relation to the sub-mount 9 as having a diameter increasing from the upper surface to the lower surface of the substrate 1. Thus, heat generated by the semiconductor laser element 10 is dissipated to the air via the sub-mount 9 and the conductive plate 13, so that the semiconductor laser element 10 can efficiently naturally cooled.

With the aforesaid arrangement, when the semiconductor laser device 101 is inserted in the cylindrical mount hole 107 of the housing 102 shown in FIG. 2, the outer peripheral surface portions 3a to 3d of the substrate support blocks 2a to 2d are fitted along an interior wall surface of the mount hole 107 as shown in FIG. 1. At this time, the optical axis of the hologram element 101 is aligned with the optical axis of the objective lens 104. The hologram element 101 is an optical element which guides a laser beam from the semiconductor laser element 10 toward the optical disk 103 via the objective lens 104 (FIG. 1) and guides a light beam reflected from the optical disk 103 to the light receiving element 11 via the objective lens 104.

The light beam reflected from the optical disk 103 includes three beams (three components), i.e., one beam for reading recorded information from the optical disk 103, and two beams for reading positional information indicative of a position at which the laser beam is incident on the optical disk 103.

Therefore, the positional adjustment of the beam reflected from the optical disk 103 and incident on the light receiving element 11, i.e., the positional adjustment of the three beams on the light receiving element 11, can easily be achieved by rotating the semiconductor laser device 101 about the optical axis of the objective lens 104 by holding an end face of the substrate 1 between the blocks 2b and 2a and an end face of the substrate 1 between the block 2c and 2d (FIG. 5) by means of a proper tool when the semiconductor laser device is fitted in the mount hole 107.

When the distal ends of the leads 51 to 62 are connected to a drive circuit, the semiconductor laser element 10 emits a laser beam parallel to the upper surface of the substrate 1. Then, the laser beam is reflected on the mirror 12 to travel perpendicularly to the upper surface of the substrate 1, and projected on the optical disk 103 via the hologram element 106 and the objective lens 104 as shown in FIG. 1. The laser beam reflected on the optical disk 103 passes through the objective lens 104 and the hologram element 106, and is received by the light receiving element 11. Thus, the information on the optical disk 103 is read.

Next, an explanation will be given to a production process for the semiconductor laser device 101.

Figure 8:
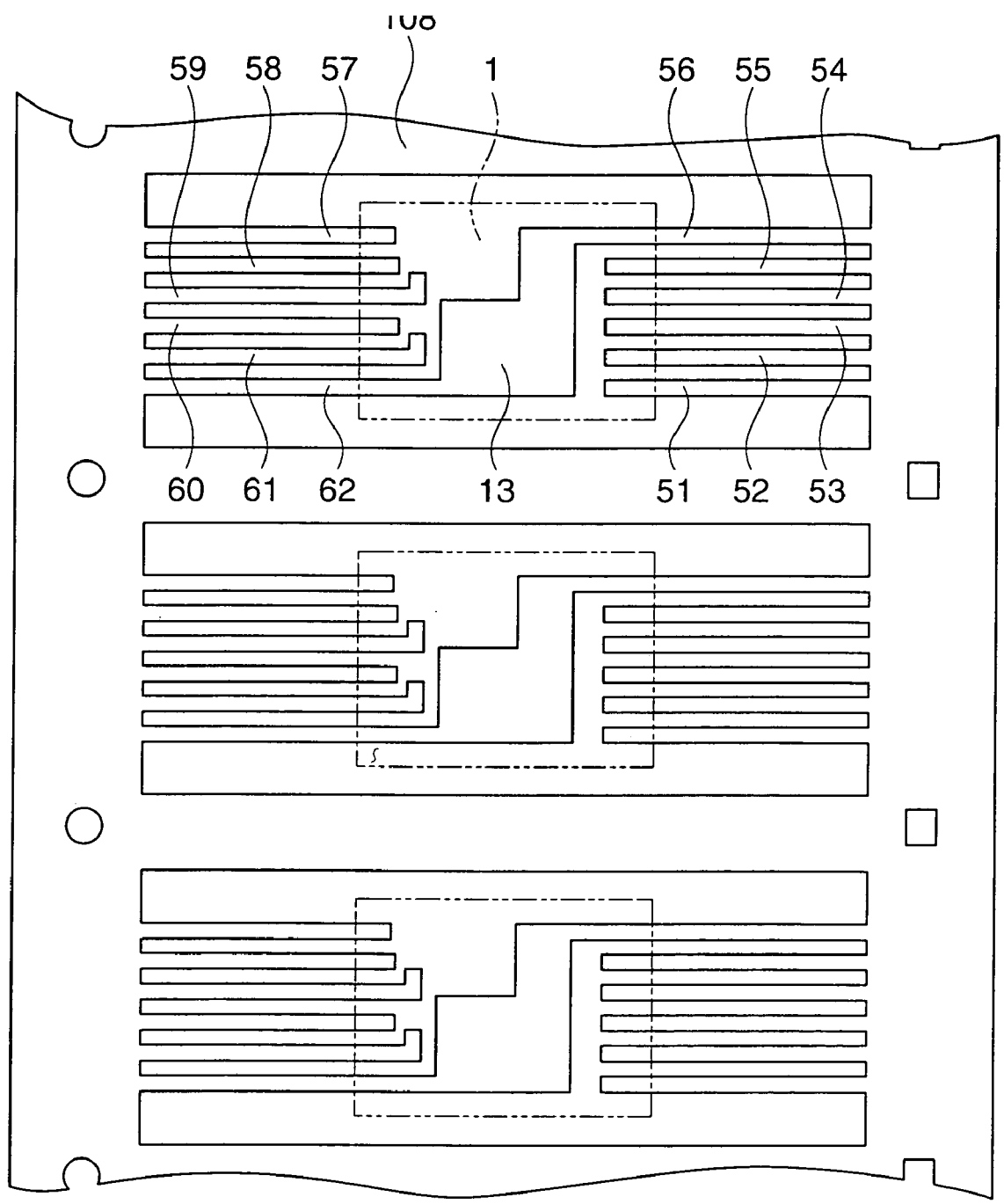
FIG. 8 is a top view of a lead frame for use in a production process for the semiconductor laser device of FIG. 1.

First, a lead frame 108 as shown in FIG. 8 is stamped from a copper plate by a press. The stamped lead frame 108 includes plural sets of leads 51 to 62 and a conductive plate (island plate) 13 integral with the leads 56, 62, which are arranged in tandem. The lead frame 108 is set in a mold, and a thermo-setting epoxy resin is injected into the mold for injection molding, whereby a substrate 1, blocks 2a to 2d and 4a to 4d and blocks 6 to 8 are simultaneously and integrally molded and fixed to the lead frame 108.

Then, a sub-mount 9 mounted with a semiconductor laser element 10 is bonded onto an upper surface of the conductive plate 13 on the substrate 1 by a silver paste. It is noted that the semiconductor laser element 10 is preliminarily bonded onto the sub-mount 9.

In turn, a glass mirror 12 is bonded onto the block 8 by a UV curable resin.

Subsequently, a light receiving element 11 is bonded onto the block 7 by a UV curable resin.

Then, the semiconductor laser element 10 and the light receiving element 11 are connected (wire-bonded) to the leads 51 to 62 and the conductive plate 13 by gold wires.

In turn, a hologram element 106 is mounted on the blocks 4a to 4d.

Subsequently, the leads 51 to 62 are separated from the lead frame 108, and bent by means of a predetermined tool. Thus, distal portions of the leads 51 to 62 are bent perpendicularly at positions spaced a distance L apart from the substrate 1 as shown in FIG. 6.

Through the aforesaid process, the semiconductor laser device 101 is completed.

Where the size of the semiconductor laser element 10 [the semiconductor laser device 101] is further reduced, the distance L between the bending points of the leads 51 to 62 and the substrate 1 may be reduced.

Figure 9:
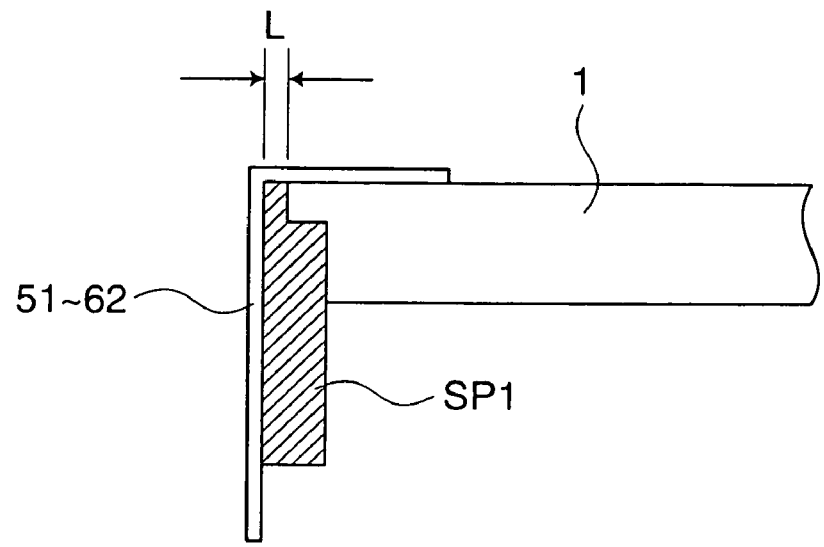
FIGS. 9 and 10 are diagrams for explaining a process for bending leads of the semiconductor laser device of the first embodiment.
Figure 10:
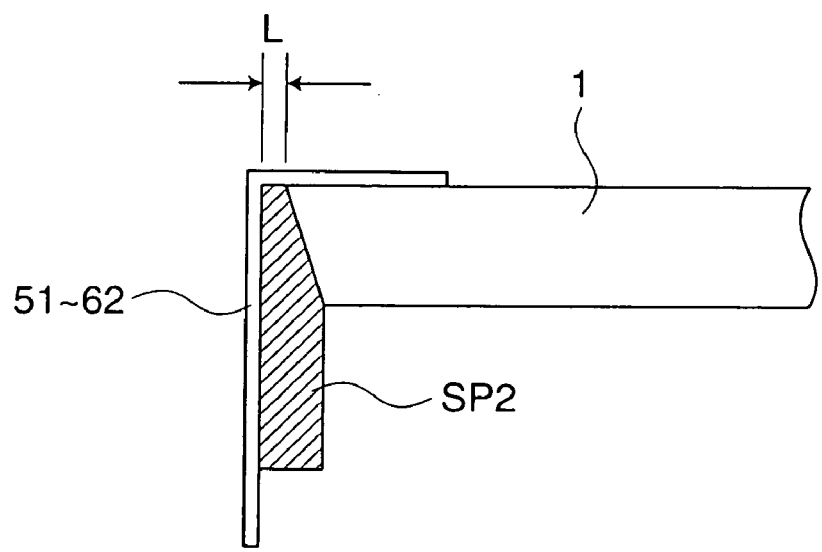

In this case, end faces of the substrate 1 are preliminarily stepped or tapered as shown in FIG. 9 or 10. With this arrangement, the bending of the leads 51 to 62 can stably be achieved by employing a relatively thick spacer SP1 or SP2.

The aforesaid production process can be employed for the production of semiconductor laser devices according to the following second to seventh embodiments.

Second Embodiment

Figure 11A:
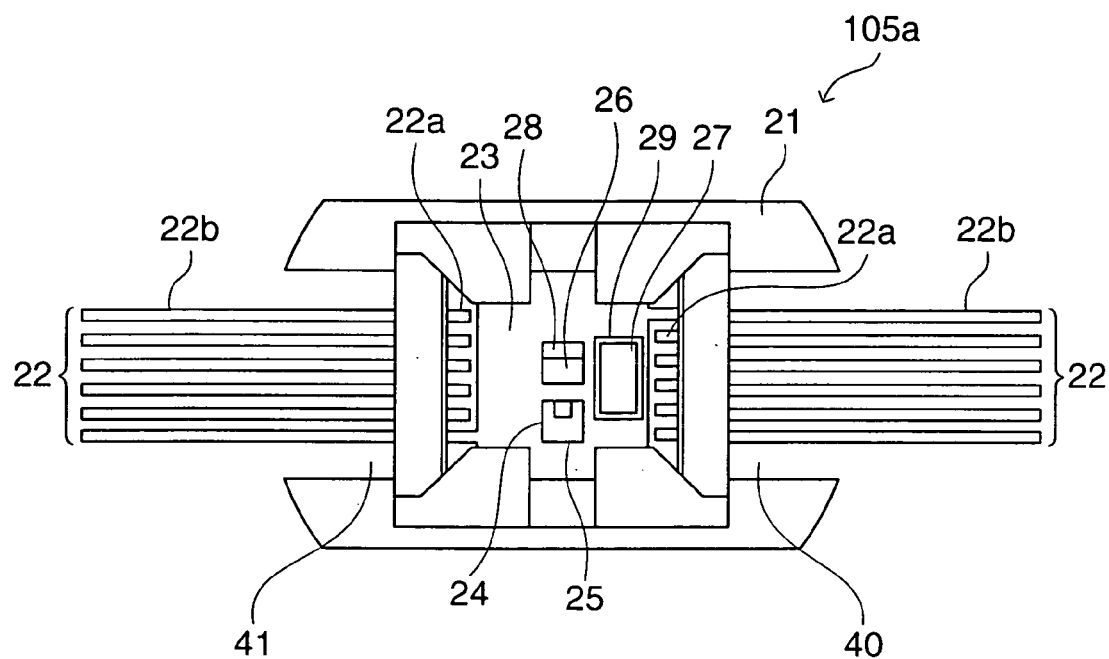
FIG. 11(a) is a top view of a semiconductor laser device according to a second example embodiment before leads are bent.
Figure 11B:
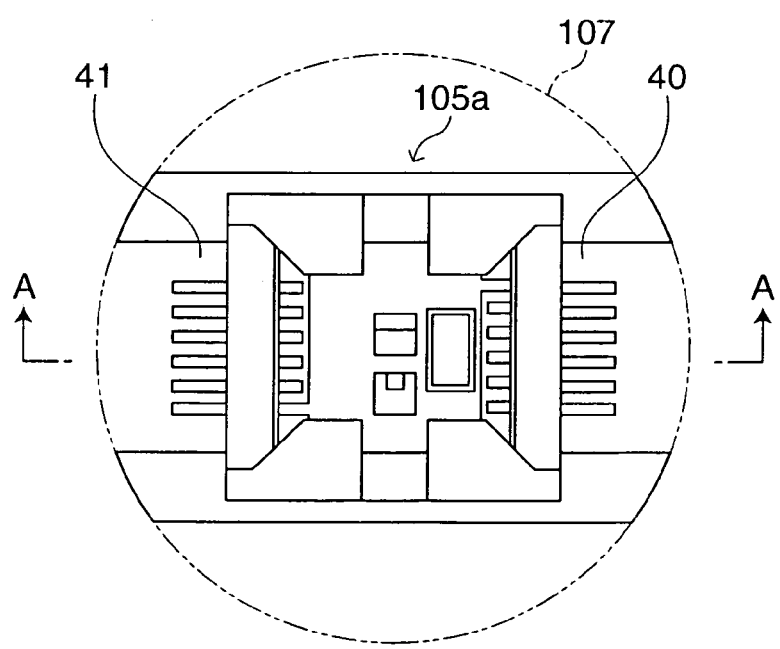
FIG. 11(b) is a top view of the semiconductor laser device after the leads are bent.
Figure 11C:
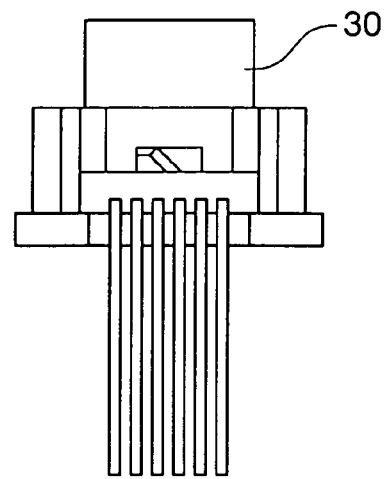
FIG. 11(c) is a left side view of the device shown in FIG. 11(b)
Figure 11D:
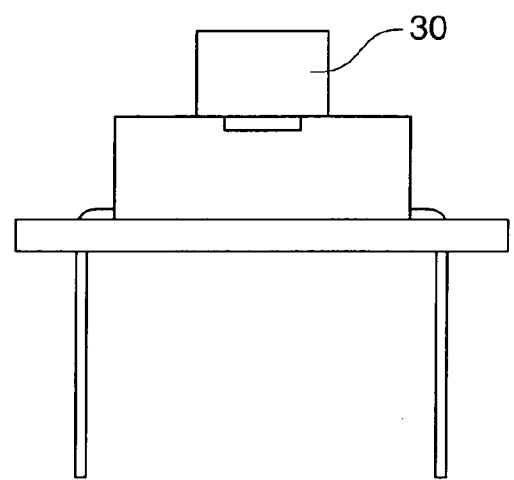
FIG. 11(d) is a front view of the device shown in FIG. 11(b)
Figure 11E:
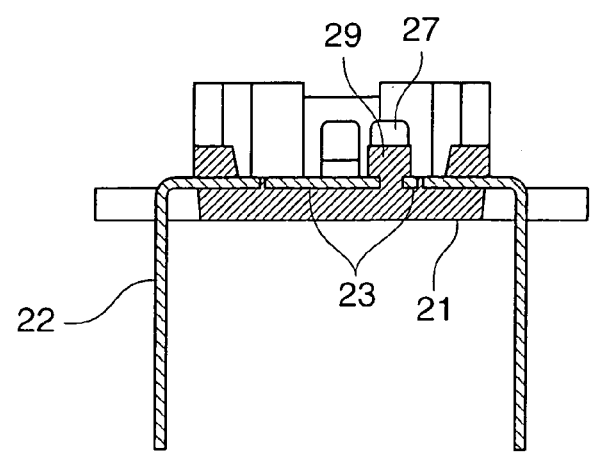
FIG. 11(e) is a sectional view of the device as seen in an arrow direction A—A in FIG. 11(b)

FIG. 11(a) is a top view of a semiconductor laser device according to a second example embodiment before leads are bent, and FIG. 11(b) is a top view of the semiconductor laser device after the leads are bent. FIGS. 11(c) and 11(d) are a left side view and a front view, respectively, of the device. FIG. 11(e) is a sectional view of the device as seen in an arrow direction A—A in FIG. 11(b).

In FIG. 11(a), a package 105a includes a substrate 21. The substrate 21 is of a generally rectangular shape as seen from the top, and has longitudinal edges extending laterally. The package 105a includes a plurality of interconnection leads (six interconnection leads) 22 provided on each of two opposite transverse edges thereof as extending from the inside to the outside of the package 105a. The substrate 21 has cut-away portions 40, 41 respectively provided on the two opposite transverse edges.

A sub-mount 25 mounted with a semiconductor laser element 24, a mirror 26 for reflecting a beam emitted from the semiconductor laser element 24 along the optical axis thereof, and a light receiving element 27 are provided on an island plate 23 inside the package 105a.

The sub-mount 25 is directly bonded onto the island plate 23, and the mirror 26 and the light receiving element 27 are respectively bonded onto a mirror support block 28 and a light receiving element support block 29 formed integrally with the substrate 21.

Though not shown in FIGS. 11(a) and 11(b) for clarity, an optical element (hologram element) 30 is provided on an upper surface of the package 105a as shown in FIG. 11(d). The optical element 30 causes light emitted from the semiconductor laser element 24 and reflected on a reflective object (optical disk) containing external information recorded thereon to be incident on the light receiving element.

In the package 105a, electrodes of the semiconductor laser element 24 and the light receiving element 27 are connected to inner leads 22a of the leads 22 by gold wires (not shown).

The package 105a is molded from an insulative resin in the same manner as in the first embodiment with a lead frame including the leads 22 and the island plate 23 embedded therein. Just after the molding, the leads 22 extend laterally from the package 105a. As shown in FIGS. 11(b) to 11(e), the leads 22 are bent toward a rear surface of the package 105a as extending through the cut-away portions 40, 41. Thus, the package 105a can be fitted in a mount hole 107, as shown in FIG. 11(b), in the same manner as in the first embodiment.

Third Embodiment

Figure 12A:
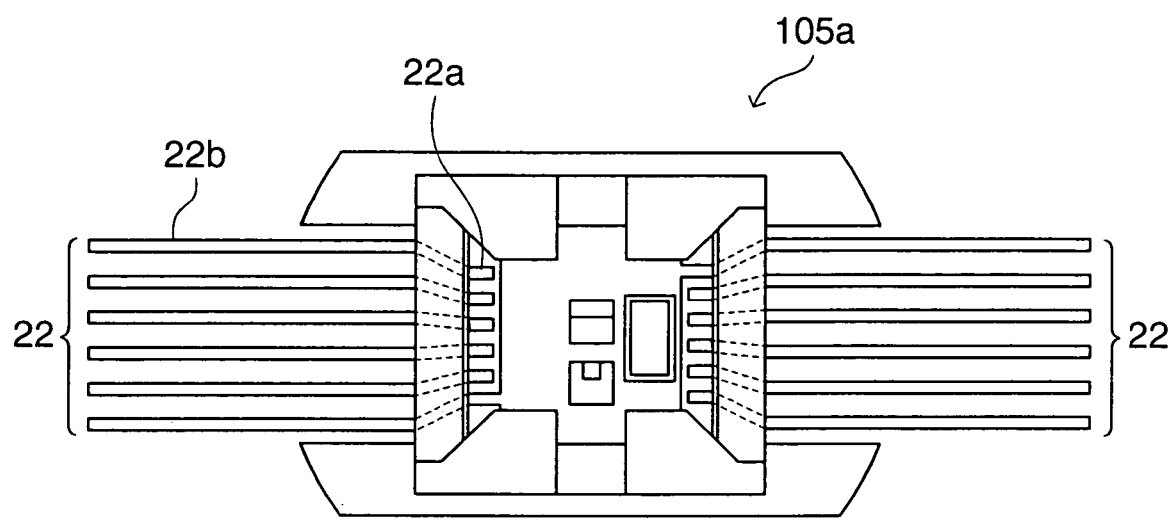
FIGS. 12(a) and 12(b) are top views of a semiconductor laser device according to a third example embodiment before and after leads are bent.
Figure 12B:
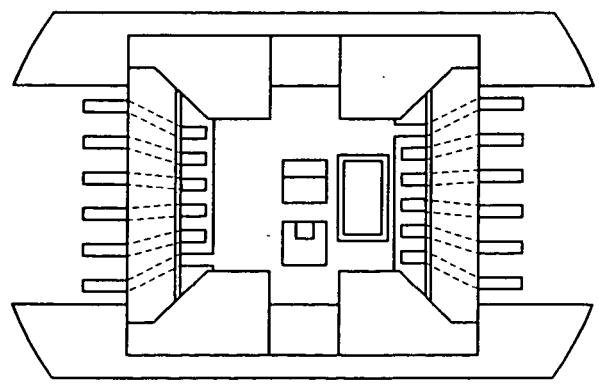

Next, a third embodiment will be described with reference to FIGS. 12(a) and 12(b). FIGS. 12(a) and 12(b) are top views of a semiconductor laser device according to the third embodiment before and after leads are bent.

The third embodiment has substantially the same construction as the second embodiment, except that the intervals of the inner lead portions 22a of the leads 22 present inside the package 105a are progressively increased toward outer lead portions 22b of the leads 22 present outside the package 105a as shown in FIGS. 12(a) and 12(b).

Thus, the outer lead portions 22b are arranged at greater intervals than in the second embodiment. Therefore, the leads 22 of the semiconductor laser device according to this embodiment can more easily be soldered to a printed wiring board.

Fourth Embodiment

Figure 13A:
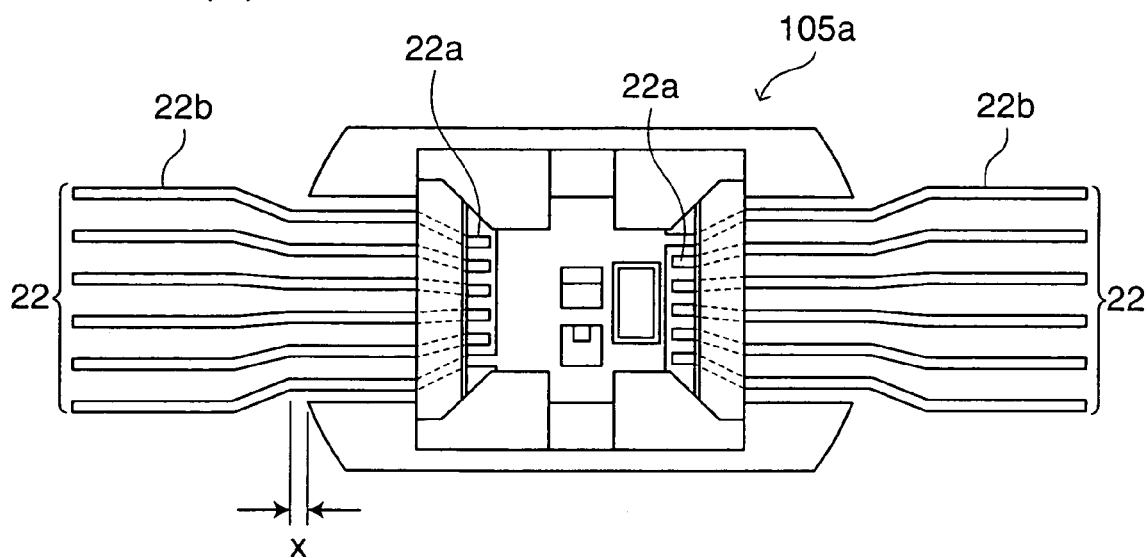
FIGS. 13(a) and 13(b) are top views of a semiconductor laser device according to a fourth example embodiment before and after leads are bent.
Figure 13B:
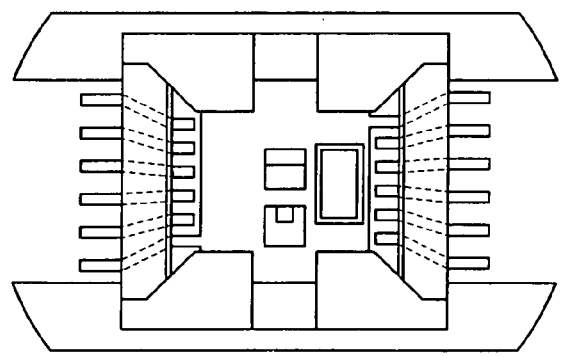
Figure 13C:
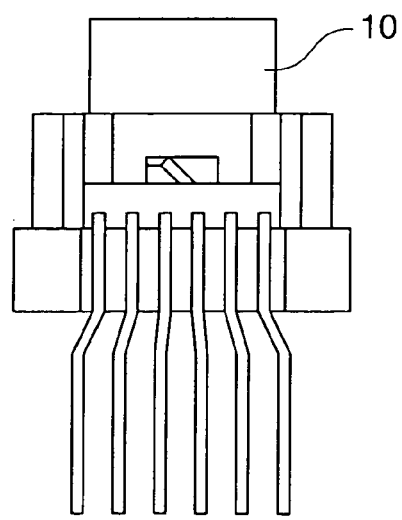
FIG. 13(c) is a left side view of the device shown in FIG. 13(b)

Next, a fourth embodiment will be described with reference to FIGS. 13(a) to 13(c). FIGS. 13(a) and 13(b) are top views of a semiconductor laser device according to the fourth embodiment before and after leads are bent, and FIG. 13(c) is a left side view of the device.

The semiconductor laser device of the fourth embodiment has substantially the same construction as the semiconductor laser device of the second embodiment, except that the intervals of the inner lead portions 22a of the leads 22 are progressively increased toward the outer lead portions 22b and, in addition, the intervals of middle portions of the outer lead portions 22b are progressively increased.

The middle portions of the outer lead portions 22b having the progressively increased intervals are spaced a distance x apart from the peripheral wall of the package 105a so as to be kept out of contact with the package 105a.

Thus, the outer lead portions 22b of the leads 22 are arranged at further greater intervals than in the third embodiment. Therefore, the leads 22 of the semiconductor laser device according to the fourth embodiment can more easily be soldered to a printed wiring board.

Fifth Embodiment

Figure 14:
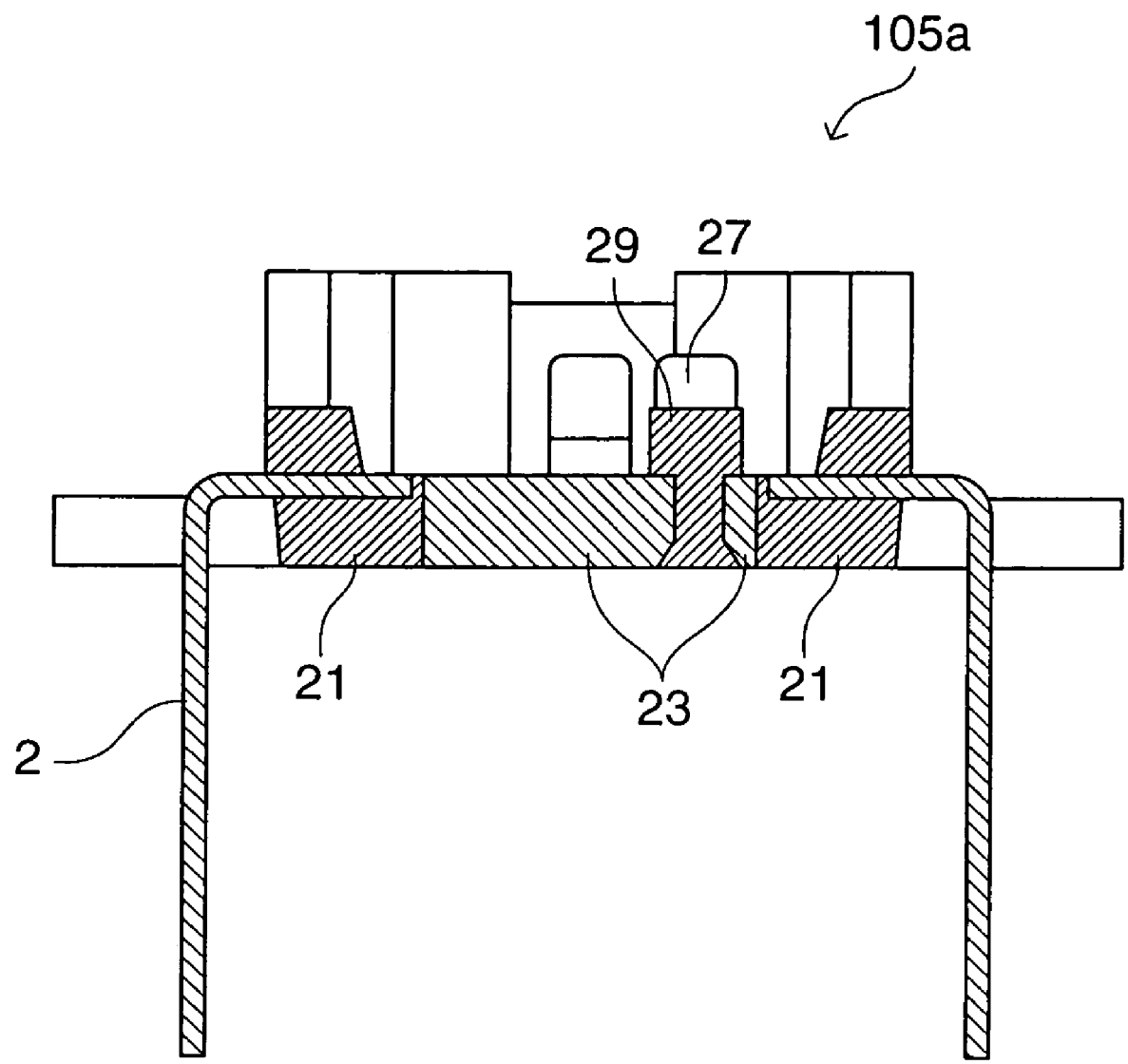
FIG. 14 is a sectional view illustrating a fifth example embodiment.

Next, a fifth embodiment will be described with reference to FIG. 14. FIG. 14 is a sectional view corresponding to FIG. 11(e). The light receiving element support block 29 is integral with the substrate 21 in FIG. 11(e). However, in this embodiment, the island plate 23 has a greater thickness and is exposed to the rear surface of the substrate 21, so that the light receiving element support block 29 is separated from the substrate 21 as shown in FIG. 14. Except this point, the fifth embodiment has substantially the same construction as the second embodiment.

Thus, the light receiving element support block 29 is supported at a predetermined position on the island plate 23 independently from the substrate 21. Therefore, even if the package 105a is subjected to a temperature change or an external force in a mounting process, a horizontal force is not exerted on the light receiving element support block 29, so that the light receiving element support block 29 is free from displacement and deformation. Hence, the light receiving element 27 can maintain stable optical characteristics without a change in optical position.

Though not shown, the reflective mirror support block 28 may also be constructed in the aforesaid manner.

Sixth Embodiment

Figure 15A:
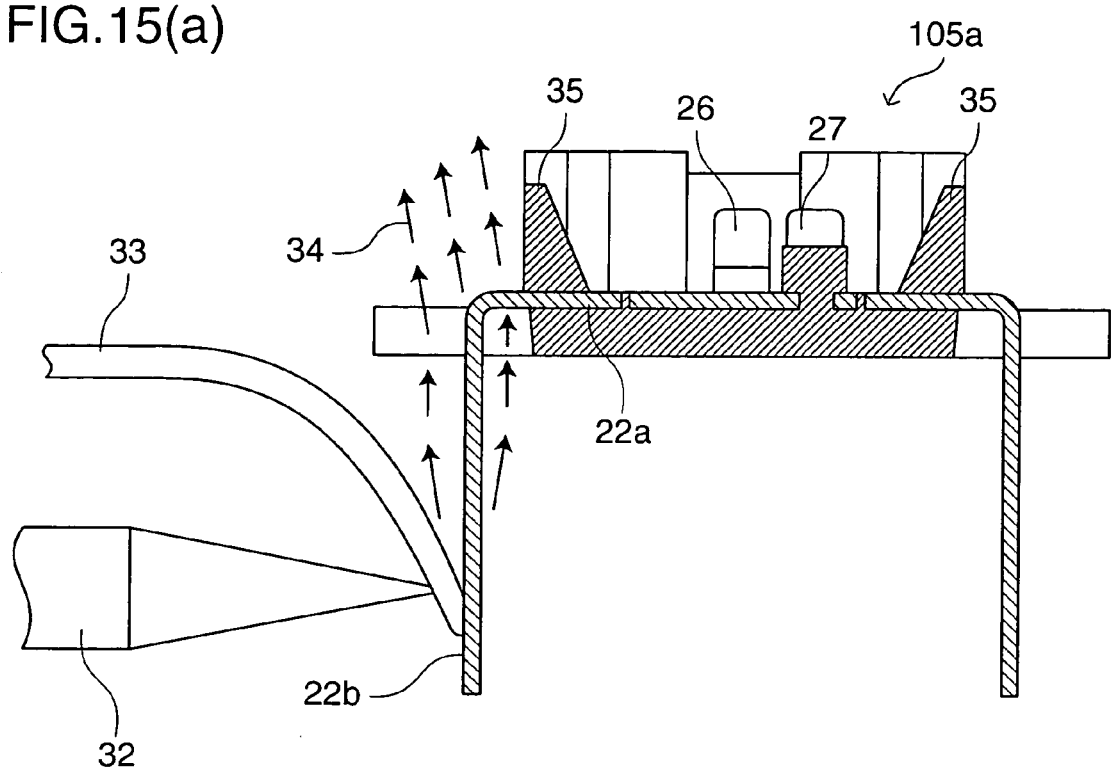
FIGS. 15(a) and 15(b) are sectional views illustrating a sixth example embodiment.
Figure 15B:
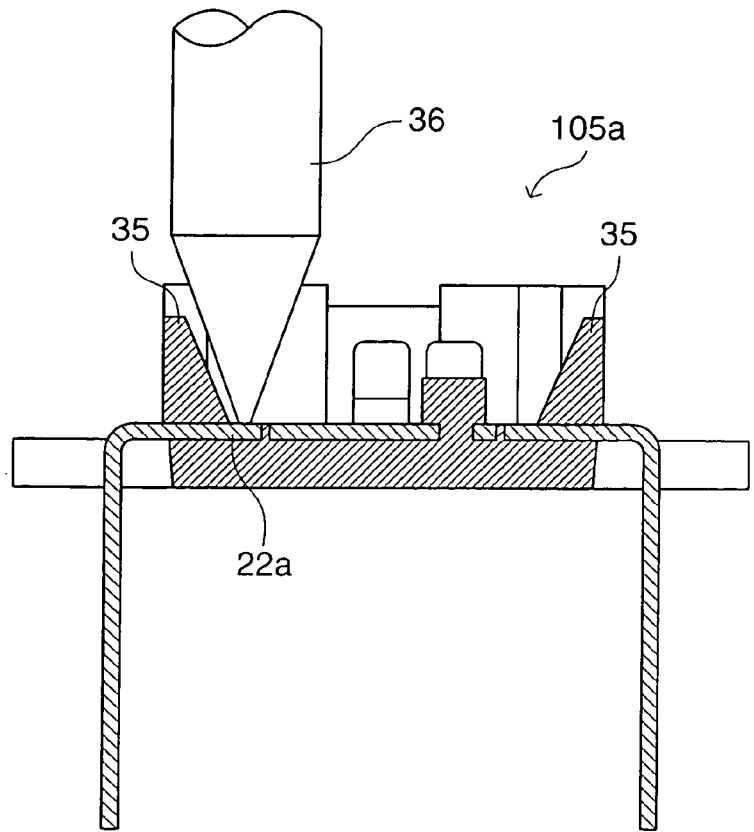

Next, a sixth embodiment will be described with reference to FIGS. 15(a) and 15(b). FIG. 15(a) illustrates how to solder a semiconductor laser device according to this embodiment onto a printed wiring board. The semiconductor laser device of this embodiment has substantially the same construction as the semiconductor laser device of the second embodiment.

A solder 33 is melted by means of a soldering iron 32, and applied onto the outer lead portions 22b to bond the outer lead portions 22b to the printed wiring board (not shown). At this time, a flux gas 34 emanates from the melted solder 33. If the flux gas 34 intrudes into the package 105a, the flux gas 34 contaminates the mirror 26, the light receiving element 27 and the optical element 30 (FIG. 11(c)) to deteriorate the optical characteristics of these elements. In this embodiment, a separation wall 35 is provided in the package 105a for separating the inner lead portions 22a from the outer lead portions 22b, whereby the intrusion of the flux gas 34 in the package 105a is prevented.

As the height of the separation wall 15 increases, the effect of blocking the flux gas 34 is enhanced. However, there is a possibility that a capillary 36 of a wire bonder interferes with the separation wall 35 when wires are bonded to the inner lead portions 22a as shown in FIG. 15(b). Therefore, the separation wall 35 is disposed at the outermost position in the package 105a, and has a height such that the separation wall 35 does not interfere with the capillary 36. Further, the separation wall 35 has a tapered interior portion.

Seventh Embodiment

Figure 16:
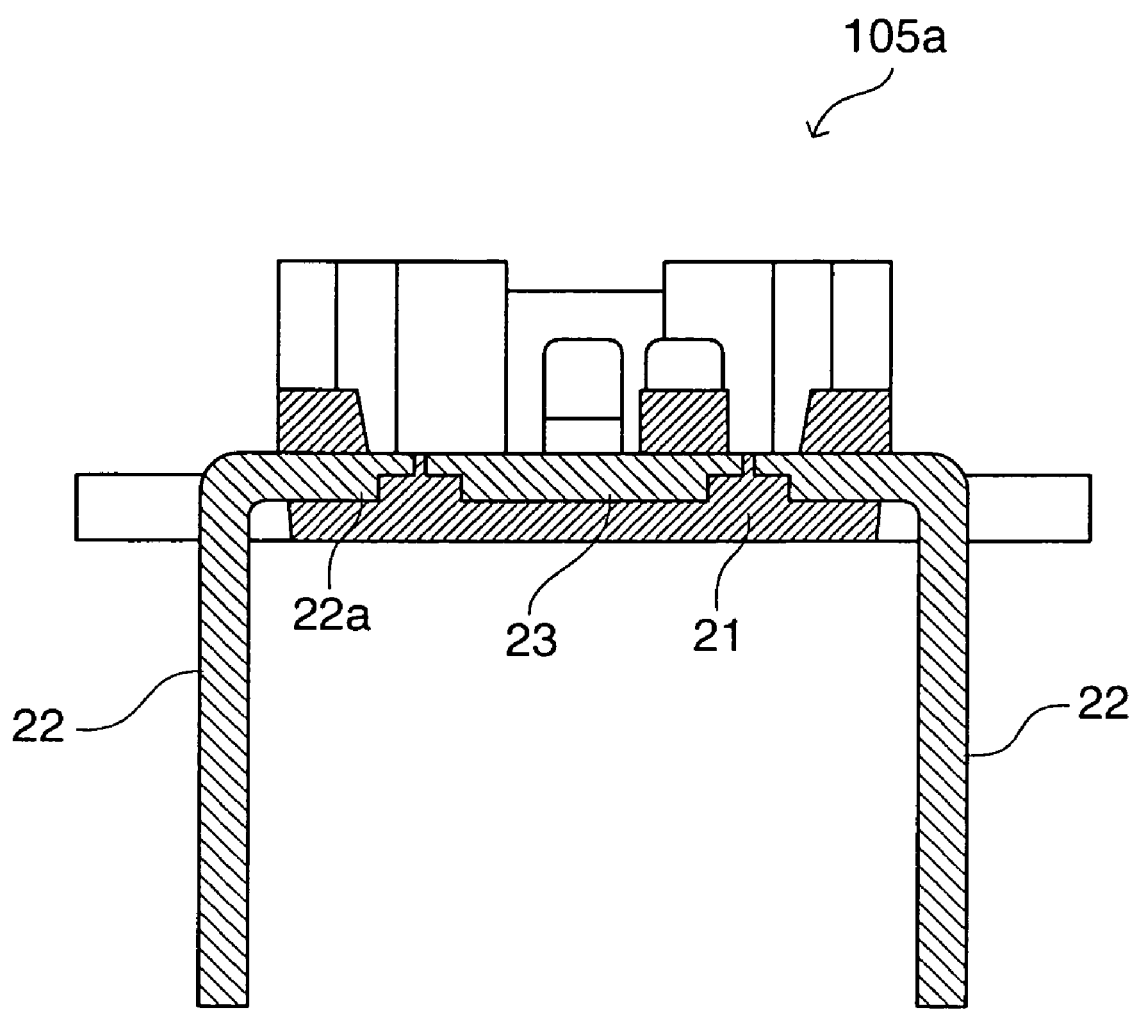
FIG. 16 is a sectional view illustrating a seventh example embodiment.

Next, a seventh embodiment will be described with reference to FIG. 16. FIG. 16 is a sectional view corresponding to FIG. 11(e). A semiconductor laser device according to this embodiment has substantially the same construction as the semiconductor laser device of the second embodiment, except that the proximal end portions of the inner lead portions 22a and the periphery of the island plate 23 each have a smaller thickness.

Where the leads 22 and the island plate 23 are stamped from a material plate by a press as described above, stamping margins of the material plate to be removed by the stamping should have a smaller width virtually equivalent to the thickness of the material plate for higher stamping accuracy. Therefore, the material plate preferably has a reduced thickness. However, the reduction in the thickness of the material plate results in easier deformation of the leads 22 and poorer heat dissipation from the island plate 23. Hence, the material plate should be relatively thick.

In this embodiment, only the stamping margins have a smaller thickness as shown in FIG. 16.

Thus, the stamping accuracy can be improved as compared with a case where a thicker material plate is stamped.

Since the thinner portions are filled with the resin, the package 105a has a sufficient mechanical strength.

Next, a production process for the semiconductor laser devices according to the second to seventh embodiments will be described. The production process is substantially the same as the production process according to the first embodiment described above, and an explanation will be given to the details of the production process not described previously.

Figure 17A:
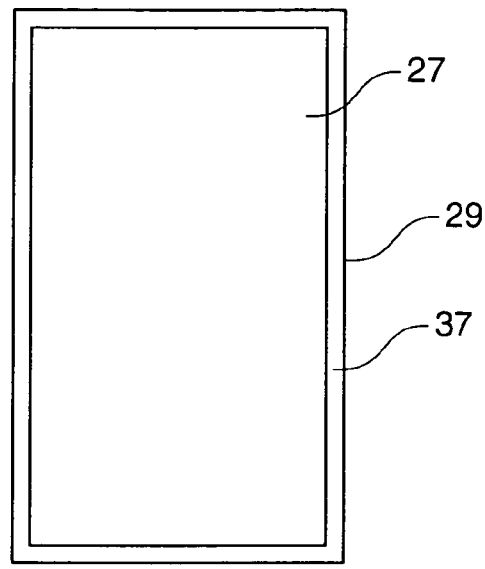
FIGS. 17(a) and 17(b) are a top view and a front view for explaining a production process in detail.
Figure 17B:
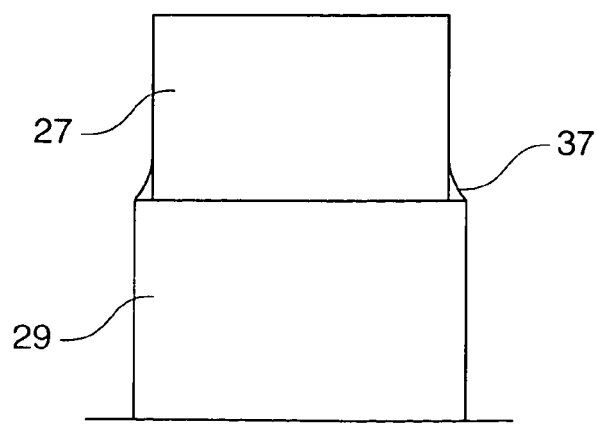

As shown in FIGS. 17(a) and 17(b), the light receiving element support block 29 has substantially the same size as the light receiving element 27. When the light receiving element 27 is placed on the light receiving element support block 29 after a UV curable resin adhesive 37 is evenly applied on the light receiving element support block 29, the UV curable resin 37 spreads uniformly along the periphery of the light receiving element 27 by the surface tension thereof. Thus, the light receiving element 27 is centered on the block 29, while the inclination of the light receiving element 27 is corrected. This eliminates the need for positioning the light receiving element 27 with respect to the block 29.

For mounting the mirror 26 on the mirror support block 28, a UV curable resin adhesive is applied on a mirror bonding surface of the mirror support block 28. Then, the mirror 26 is placed on the mirror support block 28, and fixed to the mirror support block 28 by irradiation with a UV radiation. At this time, there is a possibility that the mirror 26 is displaced or raised, because the mirror bonding surface of the mirror support block 28 is inclined at 45 degrees with respect to a horizontal plane when the package 105a is supported horizontally.

Figure 18:
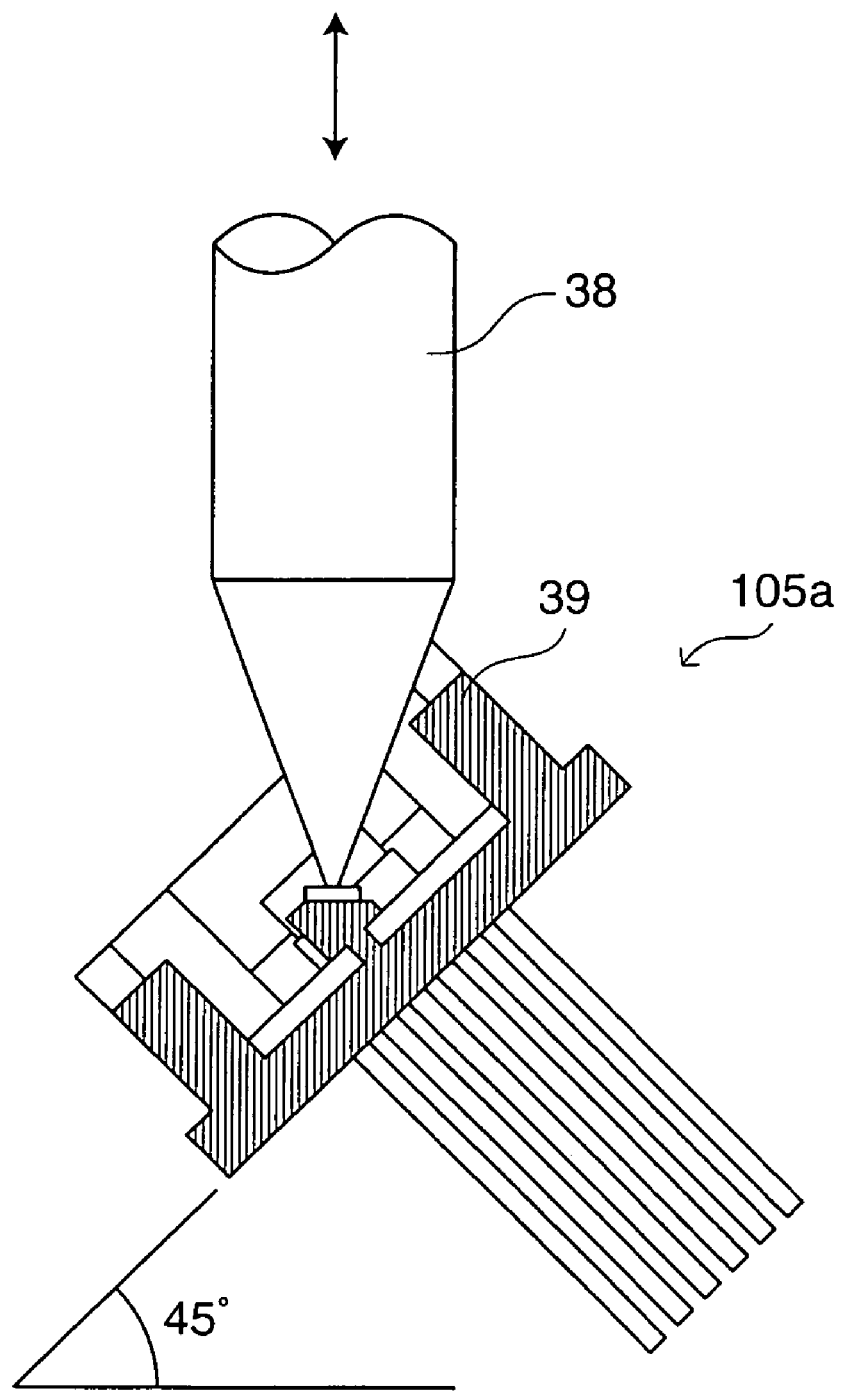
FIG. 18 is a diagram for explaining the production process in detail.

For prevention of the displacement and raise of the mirror 26, the package 105a is supported at an angle of 45 degrees with respect to the horizontal plane as shown in FIG. 18 to keep the mirror bonding surface horizontal. Then, the mirror 26 is placed on the mirror bonding surface by means of a vertically movable collet 18. Thus, the gravity acts on the mirror 26 perpendicularly to the bonding surface, whereby the displacement and raise of the mirror 26 can be suppressed.

What is claimed is:

1. A semiconductor laser device comprising:
   a package having a front surface, a rear surface and an outer peripheral surface;
   a semiconductor laser element and a light receiving element provided on the front surface;

a plurality of leads arranged in spaced relation on the front surface as extending outward from the package; and an optical element supported above the front surface with its optical axis perpendicular to the front surface for guiding a laser beam emitted from the semiconductor laser element toward an object and guiding light reflected on the object to the light receiving element;

wherein the outer peripheral surface is configured so as to be fitted in a cylindrical hole having an axis parallel to the optical axis of the optical element, and has a recess extending from the front surface to the rear surface, and the leads are bent as extending from the front surface and passing through the recess with distal portions thereof extending through the recess in the outer peripheral surface in a direction parallel to the optical axis of the optical element and with proximal ends of the leads electrically connected to the semiconductor laser element and the light receiving element;

wherein the package comprises a planar substrate, and a plurality of projections arranged in spaced relation as projecting outward from the substrate parallel to the substrate, and the recess is defined between adjacent two of the projections; and wherein the substrate is rectangular, and the projections project outward from four corners of the substrate.

2. A semiconductor laser device as set forth in claim 1, wherein the optical axis of the optical element is aligned with the axis of the cylindrical hole.

3. A semiconductor laser device as set forth in claim 1, wherein the substrate has an opening for air-cooling the semiconductor laser element.

4. A semiconductor laser device as set forth in claim 1, wherein the leads extend from two opposite edges of the rectangular substrate and is bent perpendicularly.

5. A semiconductor laser device as set forth in claim 1, further comprising a mirror provided on a surface of the substrate for reflecting the laser beam emitted from the semiconductor laser element perpendicularly to the substrate surface.

6. A semiconductor laser device as set forth in claim 1, wherein the substrate and the projections are integrally formed of the same material.

7. A semiconductor laser device as set forth in claim 1, wherein the substrate has an end face configured so as to receive a lead bending spacer between the leads and the end face of the substrate when the leads are bent.

8. A semiconductor laser device as set forth in claim 1, wherein the leads each include an inner lead portion present inside the package and an outer lead portion present outside the package, and the outer lead portions of the leads are arranged at greater intervals than the inner lead portions of the leads.

9. A semiconductor laser device as set forth in claim 8, wherein the intervals of the inner lead portions increase away from proximal portions thereof.

10. A semiconductor laser device comprising:

a substrate;

a plurality of substrate support blocks projecting outward from the substrate in spaced relation parallel to the substrate, the substrate support blocks cooperatively defining an outer peripheral surface which is configured so as to be fitted in a cylindrical hole; and a semiconductor laser element, a light receiving element, an optical element and a plurality of leads provided on a front surface of the substrate, the optical element being adapted to guide a laser beam from the semiconductor laser element toward an object and guide a light beam reflected on the object to the light receiving element;

wherein the leads have proximal ends electrically connected to the semiconductor laser element and the light receiving element, and distal portions extending from an end face of the substrate to be bent and further extending through a gap defined between adjacent two of the substrate support blocks toward a rear surface of the substrate.

11. A semiconductor laser device as set forth in claim 10, wherein the optical axis of the optical element is aligned with the axis of the cylindrical hole.

12. A semiconductor laser device as set forth in claim 10, wherein the package comprises a planar substrate, and a plurality of projections arranged in spaced relation as projecting outward from the substrate parallel to the substrate, and the recess is defined between adjacent two of the projections.

13. A semiconductor laser device as set forth in claim 12, wherein the substrate is rectangular, and the projections project outward from four corners of the substrate.

14. A semiconductor laser device as set forth in claim 13, wherein the leads extend from two opposite edges of the rectangular substrate and is bent perpendicularly.

15. A semiconductor laser device as set forth in claim 12, further comprising a mirror provided on a surface of the substrate for reflecting the laser beam emitted from the semiconductor laser element perpendicularly to the substrate surface.

16. A semiconductor laser device as set forth in claim 12, wherein the substrate and the projections are integrally formed of the same material.

17. A semiconductor laser device as set forth in claim 10, wherein the substrate has an opening for air-cooling the semiconductor laser element.

* * * * *